(12) United States Patent
Park (10) Patent No.: US 6,518,143 B2
(45) Date of Patent: Feb. 11, 2003

(54) METHOD FOR FABRICATING A LOWER PLATE FOR A CAPACITOR OF SEMICONDUCTOR DEVICE

(75) Inventor: Sang-Hee Park, Choongcheongbuk-Do (KR)

(73) Assignee: Hyundai Electronics Industries Co., Ltd, Ichon-shi (KR)

( * ) Notice: Subject to any disclaimer, the term of this patent is extended or adjusted under 35 U.S.C. 154(b) by 0 days.

(21) Appl. No.: 09/928,657

(22) Filed: Aug. 14, 2001

(65) Prior Publication Data

US 2002/0028562 A1 Mar. 7, 2002

(30) Foreign Application Priority Data

Aug. 31, 2000 (KR) .............................. 00-51219

(51) Int. Cl.⁷ .............................................. H01L 21/20
(52) U.S. Cl. ...................... 438/398; 438/253; 438/255; 438/396; 257/309
(58) Field of Search ................................ 438/253, 254, 438/255, 396, 397, 398; 257/309

(56) References Cited

U.S. PATENT DOCUMENTS 5,496,757 A * 3/1996 Rosner ........................ 438/253
5,622,889 A * 4/1997 Yoo et al. .................... 438/397
6,100,136 A * 8/2000 Lin et al. ..................... 438/253
6,391,712 B2 * 5/2002 Ji ................................ 257/303

* cited by examiner

*Primary Examiner*—Carl Whitehead, Jr.
*Assistant Examiner*—Jeff Vockrodt
(74) *Attorney, Agent, or Firm*—Fleshner & Kim, LLP

(57) ABSTRACT

A method for fabricating a lower plate of a capacitor of a semiconductor device, including forming a planarization layer on a semiconductor substrate, forming a conductive plug in the planarization layer, forming a first nitride film on the planarization layer and the top surface of the conductive plug, forming a first oxide film on the top surface of the first nitride film with a trench in the first oxide film around the conductive plug, forming a second nitride film in the trench, removing the first oxide film, forming a second oxide film, exposing the top surface of the conductive plug, forming a silicon layer pattern on the top surface of the conductive plug and the side walls of the second oxide film, removing the second oxide film, forming silicon grains on the surface of the silicon layer pattern, and removing the second nitride film.

18 Claims, 10 Drawing Sheets

METHOD FOR FABRICATING A LOWER PLATE FOR A CAPACITOR OF SEMICONDUCTOR DEVICE

BACKGROUND OF THE INVENTION

1. Field of the Invention

The present invention relates to a method for fabricating a semiconductor device, and more particularly, to a method for fabricating a lower plate for a capacitor.

2. Background of the Related Art

A memory cell of a DRAM (dynamic random access memory) includes two main parts, a field effect transistor and a capacitor. In reducing the size of the capacitor to increase the degree of integration of a memory device, the capacitance is reduced, which results in the following problems.

First, a soft error can occur. Soft error occurs when the DRAM discriminates information of '0' and '1' by the amount of electric charge accumulated in the capacitor. This occurs when pairs of electron-micropyle are additionally generated by alpha particles which affect the amount of electric charge in the capacitor causing the disturbance of information stored in the memory device, which is called as a soft error.

Second, the operating speed of the DRAM is reduced. In the DRAM, a refresh operation for periodically charging the electric charge accumulated in the capacitor of each cell is required. As the capacitance becomes smaller, the refresh time between each periodic charge becomes shorter. Since other operations are stopped during the refresh operation, the operating speed of a semiconductor device is reduced due to the decrease in refresh time.

Thus, a number of methods for fabricating a capacitor having a sufficient capacitance with a reduced area in a semiconductor substrate occupied by the capacitor have been developed. These methods can be divided into the study of the structure of the capacitor and the study of the materials of the capacitor.

With respect to the structure of the capacitor, the main areas of development are the decreasing of the thickness of a dielectric film, the increasing in the effective surface area of a lower plate of the capacitor, and the like. With respect to the materials of the capacitor, the main area of development is the search for an alternative dielectric film capable of replacing a conventional silicon oxide film.

However, the decreasing of the thickness of the dielectric film has its limitations due to leakage current characteristics, and it is difficult to replace the silicon oxide film with another material because the conventional process would have to be changed. Hence, studies are under way for the purpose of maintaining the capacitance of a capacitor by increasing the effective surface area of a lower plate of a capacitor plate.

The conventional method for fabricating a capacitor will now be described with reference to the accompanying drawings. Overall, the capacitor is fabricated by solidifying the lower plate of the capacitor into a cup shape, wherein the surface area of the lower plate is maximized by forming HSG (hemispherical silicon grain) on the surface of the lower plate.

Figure 1A:
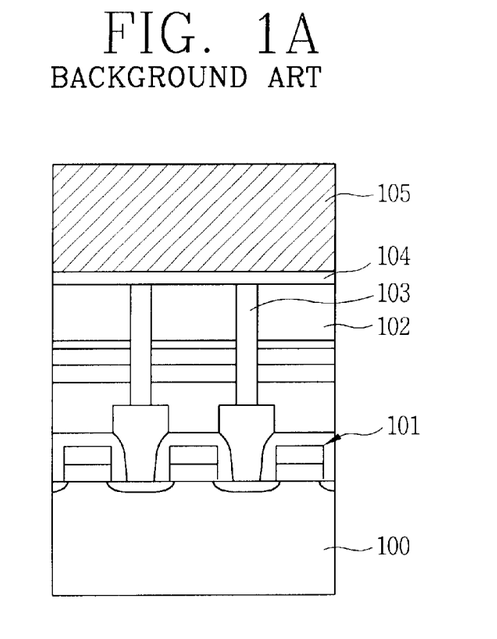
FIGS. 1A through 1F are cross-sectional views of a process illustrating a method for fabricating a lower plate of a capacitor according to the conventional art.

First, as illustrated in FIG. 1a, a plurality of respective devices 101 are formed on the top surface of a semiconductor device 100, and then a planarization layer 102 made of insulating material is formed on a top surface of the respective devices 101. Next, a contact hole is formed on the planarization layer 102, and is filled with conductive material, thereby forming a contact plug 103 so that the plug is electrically connected to the semiconductor device. Then, a nitride film 104 is formed on the planarization layer 102 and a top surface of the contact plug 103. Then, a silicon oxide film 105 is deposited by a plasma chemical vapor deposition on a top surface of the nitride film 104.

Figure 1B:
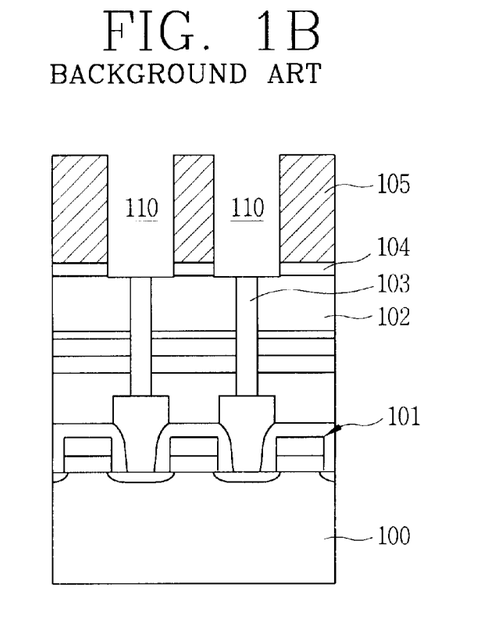

As illustrated in FIG. 1b, the nitride film 104 and the silicon oxide film 105 are partially etched to thus form an opening 110 at the nitride film 104 and the silicon oxide film 105, so that the top surface of the contact plug 103 is completely exposed.

Figure 1C:
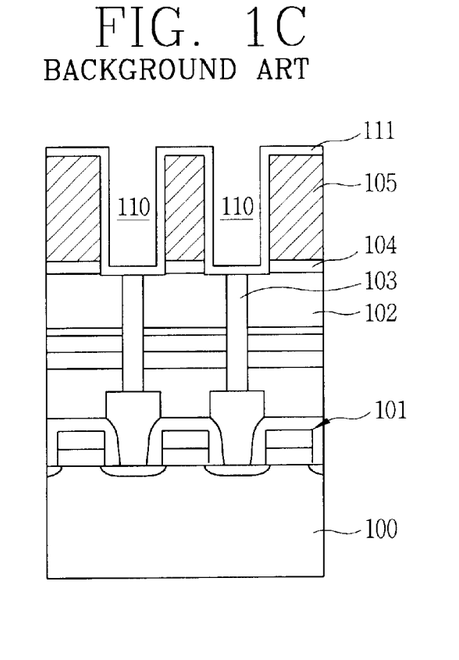

Next, as illustrated in FIG. 1c, an amorphous silicon layer 111 is deposited on the front surface of the structure of FIG. 1b by chemical vapor deposition.

Figure 1D:
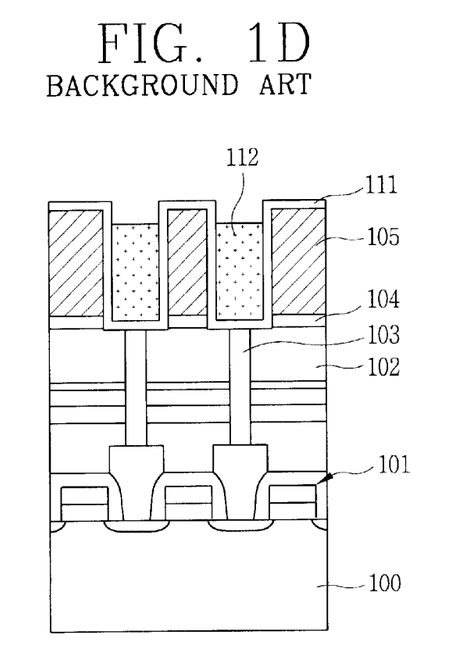

Next, as illustrated in FIG. 1d, an SOG (spin on glass) film 112 is formed on the top surface of the amorphous silicon layer 111 and in the opening 110, then an etchback process is performed to thus let the SOG film 112 remain only in the opening 110.

Figure 1E:
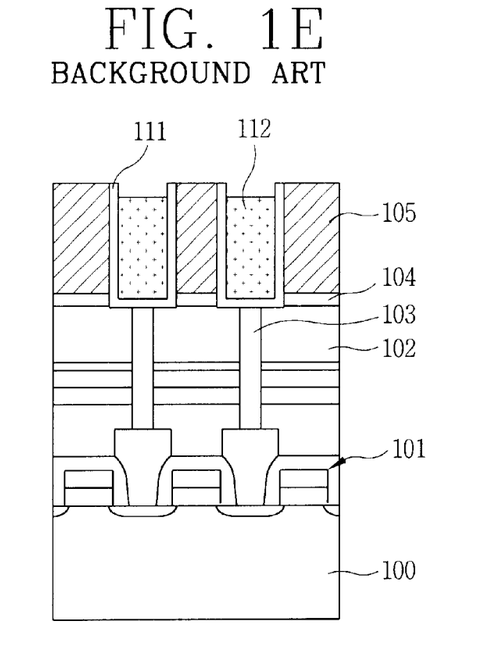

Next, as illustrated in FIG. 1e, a chemical mechanical polishing process is performed such that the amorphous silicon layer 111 on the top surface of the silicon oxide film 105 is removed.

Figure 1F:
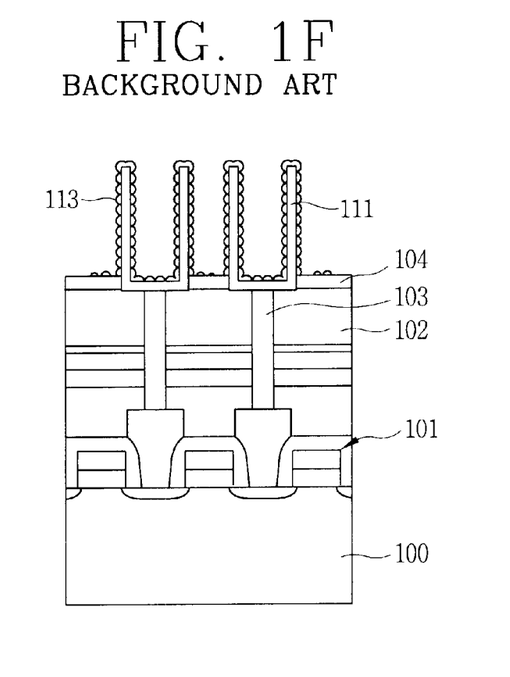

Next, as illustrated in FIG. 1f, the silicon oxide film 105 and the SOG film 112 are removed by wet etching using an oxide film etching solution, thereby leaving only an amorphous silicon pattern 111 of a cup shape. A hemispherical silicon grain (HSG) layer 113 is formed on the top surface of the silicon pattern 111, thus completing the formation of the lower plate of the capacitor.

However, the above-described conventional method for fabricating a capacitor has the following problems.

First, HSG is formed on the silicon oxide film which causes neighboring lower plates of a capacitor to be electrically short-circuited by the HSGs formed on the oxide film. Second, a bridge phenomenon occurs when the HSGs on side walls of the lower plate stick to each other.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Accordingly, it is an object of the present invention to provide a method for fabricating a lower plate of a capacitor having a high reliability and capable of increasing the capacitance by preventing a bridge between lower plates of the capacitor.

To achieve the above object, there is provided a method for fabricating a lower plate of a capacitor of a semiconductor device according to the present invention which includes forming a planarization layer on a semiconductor substrate, forming a contact hole on the planarization layer, forming a conductive plug to be electrically connected to the semiconductor substrate in the contact hole, forming a first nitride film on the planarization layer and the top surface of the conductive plug, forming a first oxide film on the top surface of the first nitride film, forming a trench around the conductive plug by partially etching the first oxide film, forming a second nitride film in the trench, etching and removing the first oxide film, forming a second oxide film on the top surface of the second nitride film and the first nitride film, exposing the top surface of the conductive plug by etching the second nitride film and the first nitride film, forming an amorphous silicon layer pattern on the top surface of the conductive plug and the side walls of the second oxide film, selectively etching and removing the second oxide film, forming silicon grains on the surface of the amorphous silicon layer to thus increase the surface area of the lower plate of the capacitor, and etching and removing the second nitride film.

In addition, to achieve the above object, there is provided a method for fabricating a lower plate of a capacitor of a semiconductor device, wherein forming a second nitride film in the trench includes forming the second nitride film in the trench and on the top surface of the first oxide film, and removing the second nitride film on the top surface of the first oxide film.

In addition, to achieve the above object, there is provided a method for fabricating a lower plate of a capacitor of a semiconductor device, wherein removing the second nitride film is an etchback process or chemical mechanical polishing process.

In addition, to achieve the above object, there is provided a method for fabricating a lower plate of a capacitor of a semiconductor device, wherein the first oxide film is a silicon oxide film formed by the chemical vapor deposition method using TEOS.

In addition, to achieve the above object, there is provided a method for fabricating a lower plate of a capacitor of a semiconductor device, wherein the second oxide film is a silicon oxide film deposited by a high temperature, low pressure chemical vapor deposition method.

In addition, to achieve the above object, there is provided a method for fabricating a lower plate of a capacitor of a semiconductor device, wherein exposing the conductive plug is a process of sequentially anisotropic etching the second oxide film and the first nitride film without using a mask.

In addition, to achieve the above object, there is provided a method for fabricating a lower plate of a capacitor of a semiconductor device, wherein forming an amorphous silicon layer pattern includes depositing the amorphous silicon layer on the top surface of the conductive plug, top surface and side walls of the second oxide film, and top surface of the second nitride film, thickly forming a photoresist layer on the amorphous silicon layer so that the top surface of the amorphous silicon layer is not exposed, etching back the photoresist layer so that the top surface of the amorphous silicon layer is exposed, and removing the amorphous silicon layer on the top surface of the second nitride film.

In addition, to achieve the above object, there is provided a method for fabricating a lower plate of a capacitor of a semiconductor device, wherein the step of removing the amorphous silicon layer on the top surface of the second nitride film is an etchback process.

In addition, to achieve the above object, there is provided a method for fabricating a lower plate of a capacitor of a semiconductor device, wherein the step of removing the amorphous silicon layer on the top surface of the second nitride film is a chemical mechanical polishing process.

In addition, to achieve the above object, there is provided a method for fabricating a lower plate of a capacitor of a semiconductor device, wherein the removing of the second nitride film is done with a wet etching method using a phosphatic ($H_3PO_4$) solution.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 2A:
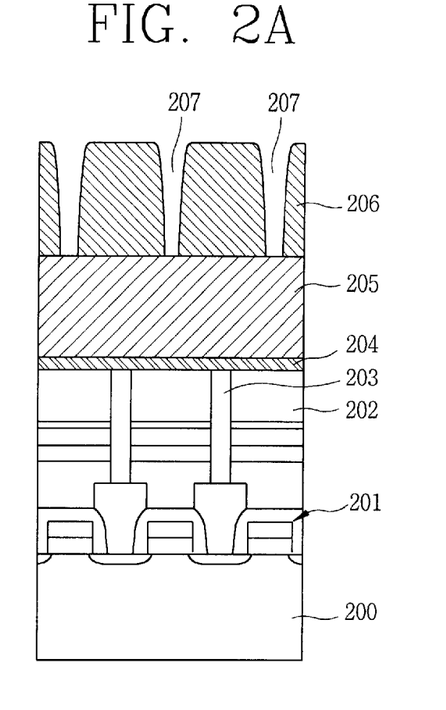
FIGS. 2A through 2M are cross-sectional views of a process illustrating a method for fabricating a lower plate of a capacitor according to the present invention.

A preferred embodiment of the present invention is a method for fabricating a lower plate for a capacitor of a semiconductor device where first, as illustrated in FIG. 2A, a plurality of respective devices 201 are formed on a top surface of a semiconductor substrate 200, and then a planarization layer 202 made of insulating material is formed on the top surface of the respective devices 201. Next, the planarization layer is partially etched to form at least one contact hole, which is filled with a conductive material to form at least one conductive plug 203 having an electric connection with the semiconductor substrate 200.

Also as illustrated in FIG. 2A, a first nitride film 204 is then formed on the top surface of the conductive plug 203 and the planarization layer 202, and a first oxide film 205 is formed on the first nitride film 204 where the first nitride film is a silicon nitride film, and the first oxide film is a silicon oxide film, which is preferably deposited by the chemical vapor deposition method preferably using TEOS (tetra ethyl orthosilicate). The silicon oxide film formed using TEOS as described above is hereinafter referred to as a TEOS film. After forming the TEOS film, a photoresist film 206 is formed on the top surface of the TEOS film, and the photoresist film 206 is then exposed to light and developed for forming a trench-type opening 207 around the conductive plug at a predetermined distance from the conductive plug 203.

Figure 2B:
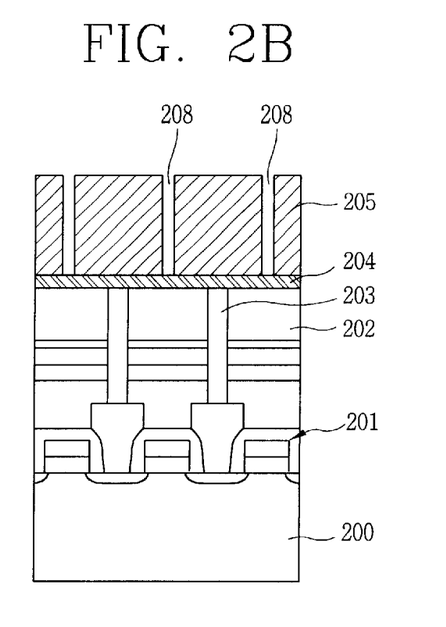
Figure 2C:
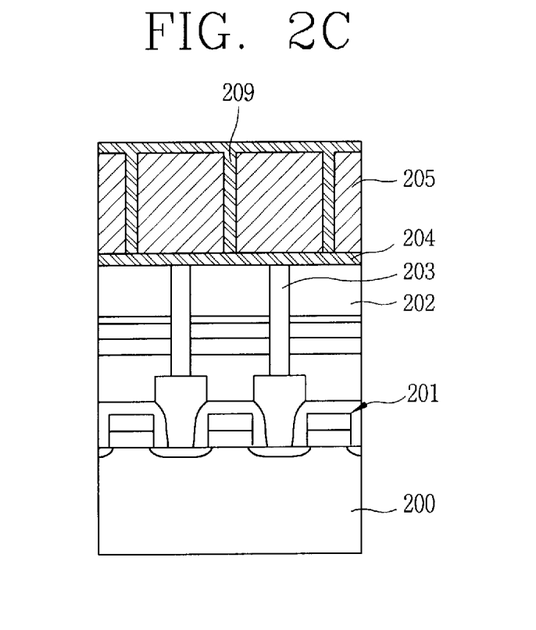

Next, as illustrated in FIG. 2B, a trench 208 is formed in the TEOS film 205 by etching the TEOS film through the opening 207, and then the photoresist film 206 is removed. Then, as illustrated in FIG. 2C, a second nitride film 209 is formed in the trench 208 and on the top surface of the TEOS film 205 preferably by a low pressure chemical vapor deposition method.

Figure 2D:
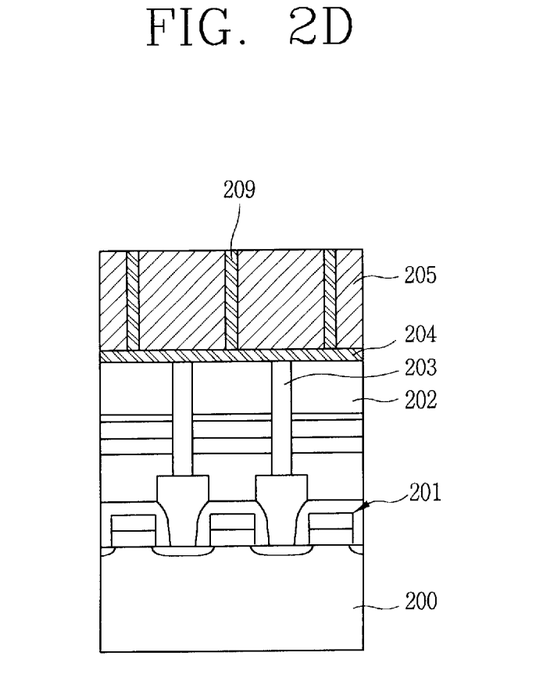
Figure 2E:
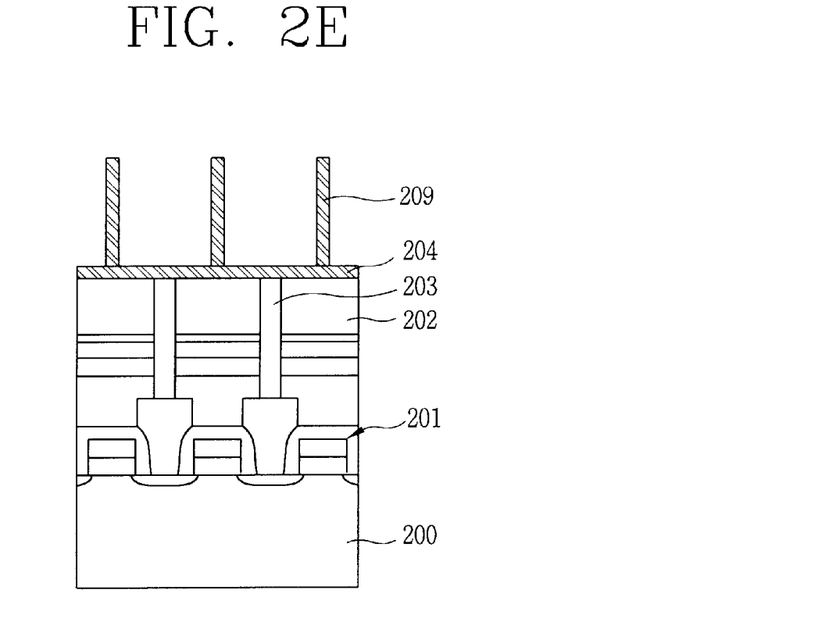

Next, as illustrated in FIG. 2D, the second nitride film 209 on the top surface of the TEOS film 205 is removed preferably by performing a chemical mechanical polishing process or an etchback process, so that the top surface of the TEOS film 205 is exposed. Then, as illustrated in FIG. 2E, the TEOS film 205 is removed preferably by a wet etching method preferably using an oxide film etching solution which leaves the second nitride film 209 pattern alone. The second nitride film 209 is disposed between lower plates of a capacitor to be formed hereinafter, and serves as a bridge barrier for blocking bridge conductance between neighboring lower plates of the capacitor, when a SEA (surface enhanced area) process for enhancing the surface area of the capacitor lower plate is performed.

Figure 2F:
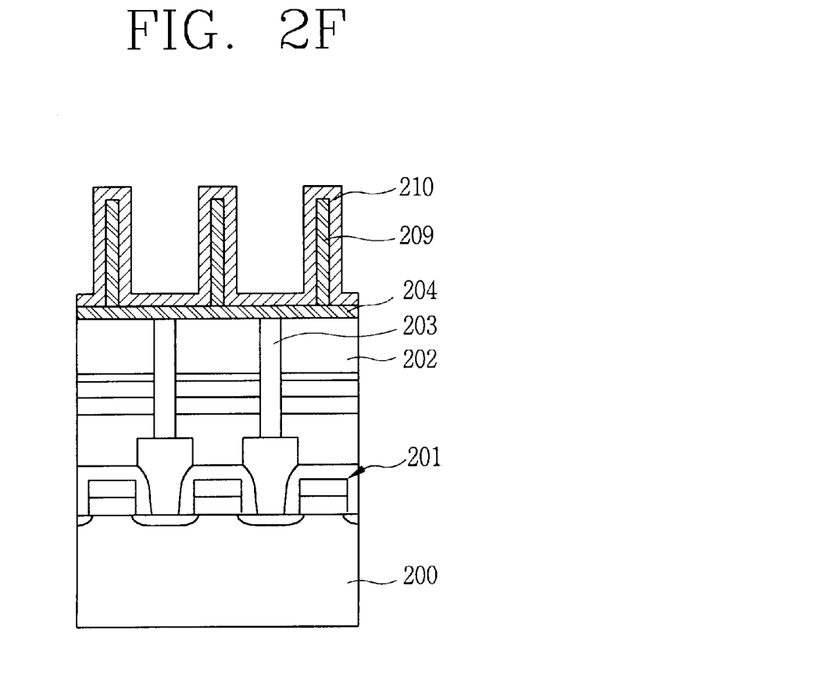
Figure 2G:
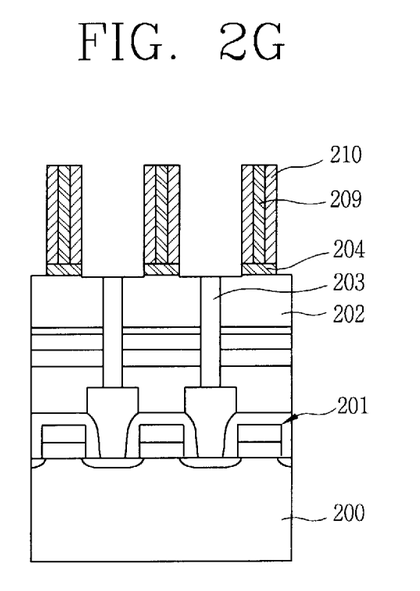

This is followed by, as illustrated in FIG. 2F, forming a second oxide film 210 on the top surfaces of the second nitride film 209 and the first nitride film 204. The second oxide film 210 is preferably a silicon oxide film which is preferably formed by a high temperature low pressure chemical vapor deposition (HLD) method, and hereinafter the second oxide film 210 will be referred to as an HLD film. Then, as illustrated in FIG. 2G, the first nitride film 204 on the top surface of the conductive plug is removed, preferably by etching with an etching time set such that the top surface of the conductive plug 203 is exposed, preferably by anisotropic etching. The top surface of the conductive plug 203 can then be exposed preferably by removing the HLD film 210 and the first nitride film 204 from the top surface of the conductive plug 203 preferably by an anisotropic etching process.

Figure 2H:
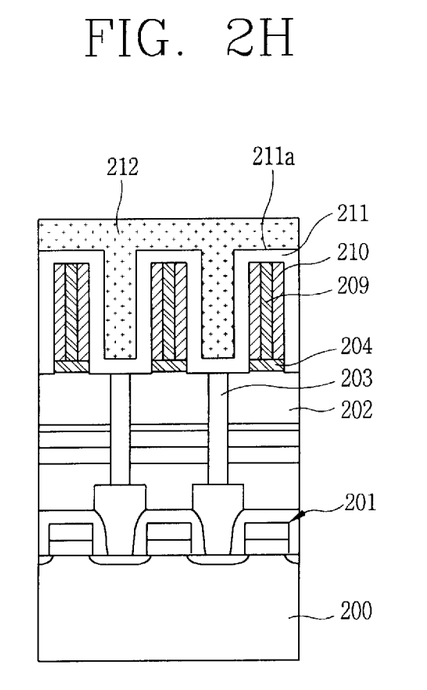
Figure 2I:
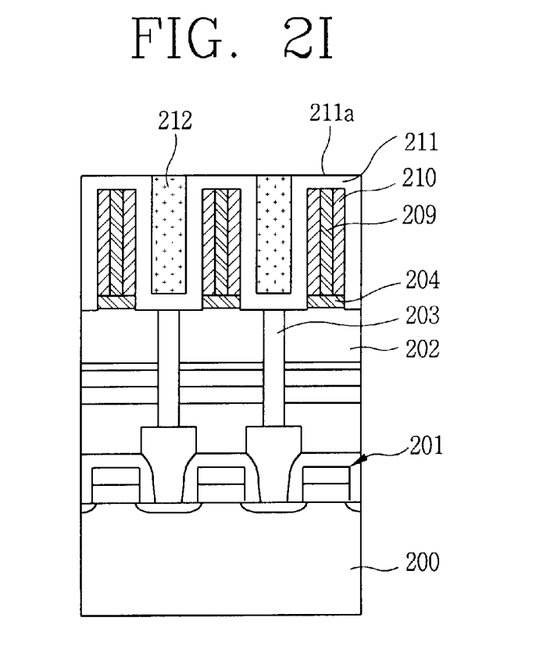

Next, as illustrated in FIG. 2H, a silicon layer 211, which is preferably amorphous, is deposited on the surface of the structure of FIG. 2G, that is, on the top surface of the conductive plug 203, the side surfaces of the first nitride layer 204, the top surface of the second nitride layer 209, the exposed top surface of the planarization layer 202, and the exposed surfaces of the HLD film 210. Then, a photoresist film 212 can be formed to a sufficient thickness such that the top surfaces of the silicon layer 211 are covered, including the highest surface 211a of the silicon layer 211. Then, as illustrated in FIG. 2I, the photoresist film 212 can then be removed, preferably by anisotropic etching without a mask to expose the highest surface 211a of the silicon layer 211.

Figure 2J:
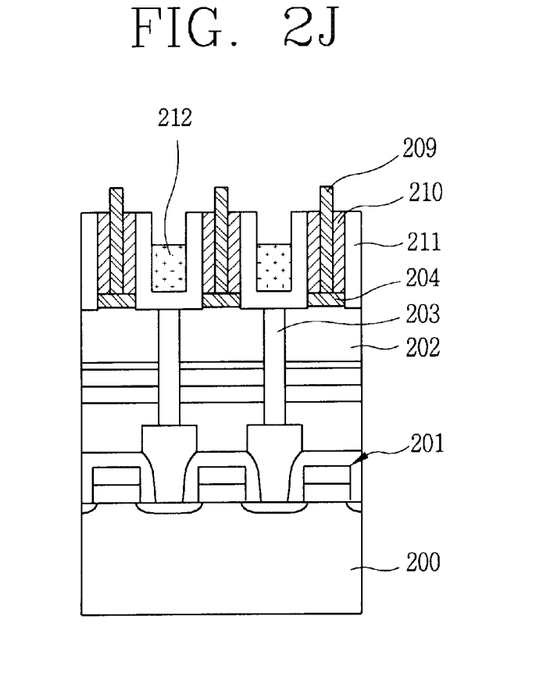

In the next step, as illustrated in FIG. 2J, the silicon layer 211 on the top surface of the second nitride film 209 can be removed preferably by etching back the silicon layer 211, or performing a chemical mechanical polishing process to pattern the silicon layer 211 into at least one cup shape formation, which can physically separate neighboring silicon layer formation of the pattern from one another. The pattern of the silicon layer 211 of the cup shape formation becomes a lower plate of the capacitor by a subsequent process.

Figure 2K:
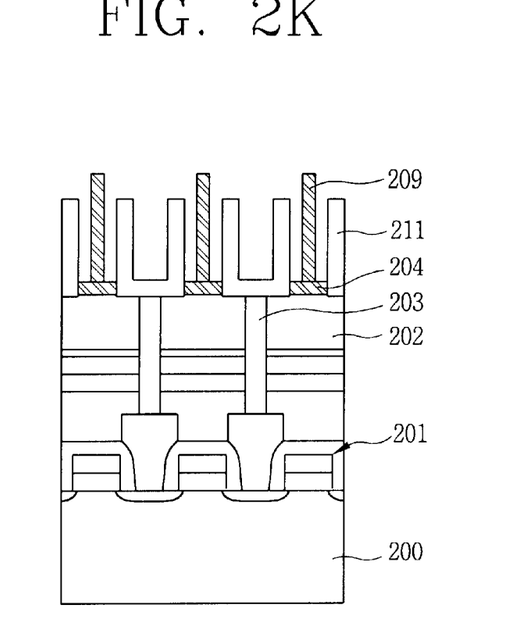
Figure 2L:
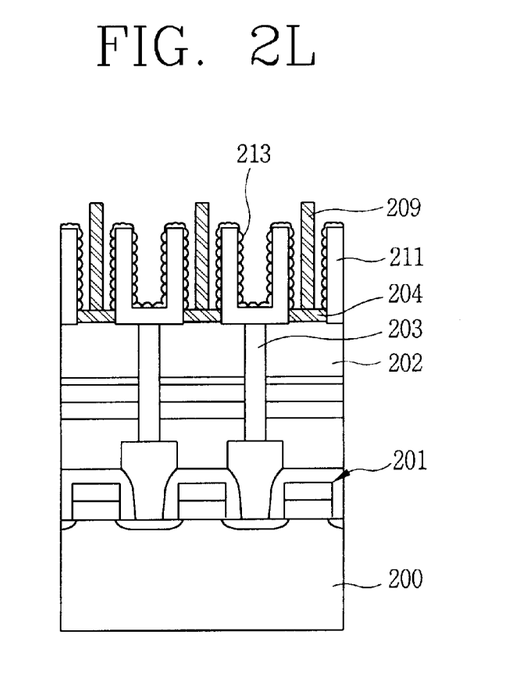
Figure 2M:
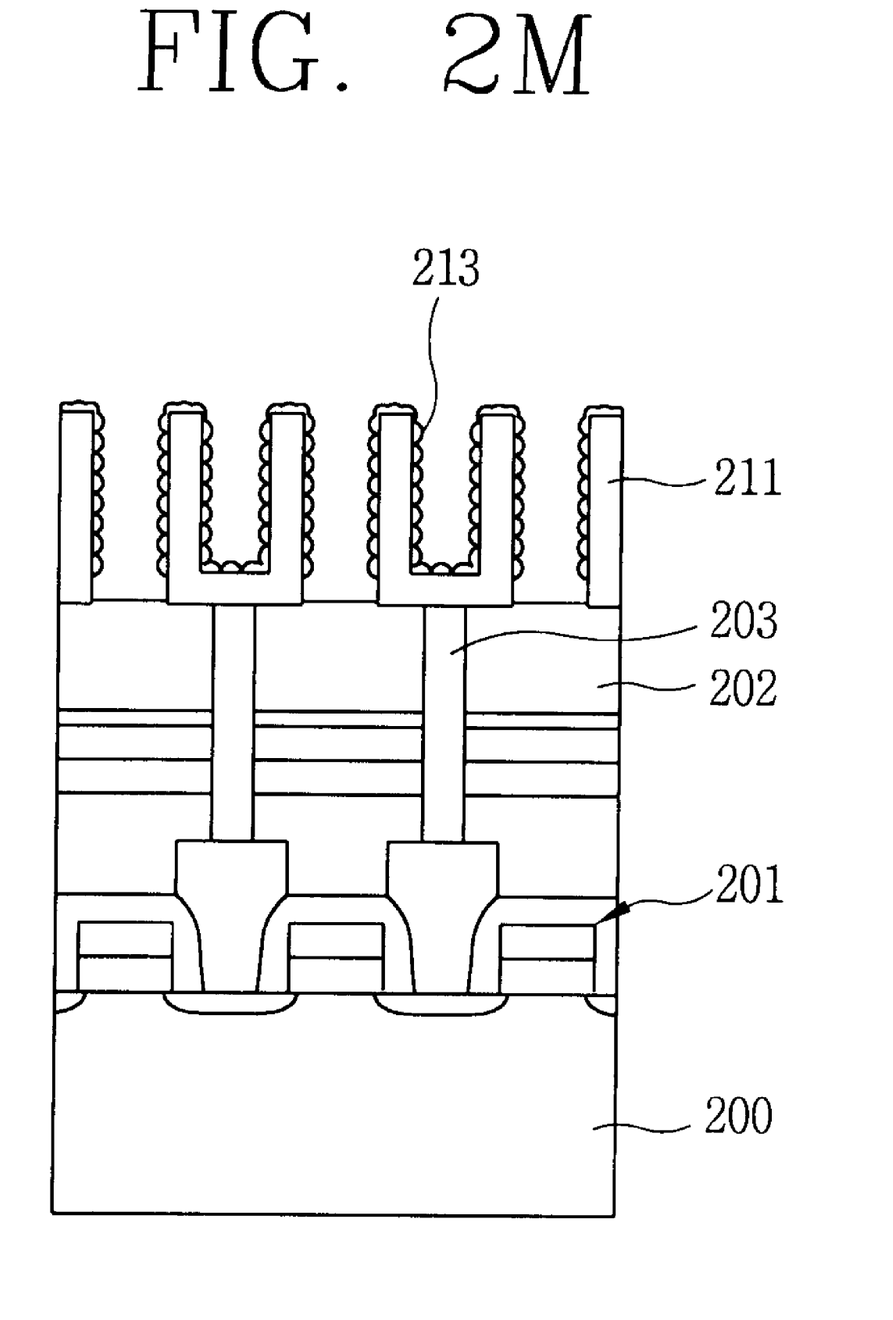

Next, as illustrated in FIG. 2K, the remaining photoresist film 212 can then be removed and can be followed by the removal of the HLD film 210, preferably by selective etching using a wet etching method. Then, as illustrated in FIG. 2L, a process (SEA process) for enhancing the surface area of the amorphous silicon layer pattern 211 can be performed. The remaining silicon layer pattern 211 is then preferably put into a vacuum anneal chamber, and silicon grains can be deposited on the surface of the silicon layer pattern 211 preferably by decomposing $Si_2H_6$ or $SiH_4$ gas at a temperature of 500~600° C. under a pressure of $10^{-7}$~$10^{-3}$ torr to form at least one nucleation site. Next, a hemispherical silicon grain layer 213 can be formed on the surface of the silicon layer 211 preferably by thermally treating the semiconductor substrate. Finally, as illustrate in FIG. 2M, the second nitride film 209 can then be selectively removed preferably by using a phosphatic ($H_3PO_4$) solution.

The present invention allows the fabrication of a capacitor with a high capacitance by maximizing the surface area of a lower plate of a capacitor. In addition, the reliability of the fabrication of a semiconductor device is improved by forming a nitride film pattern between neighboring lower plates of the capacitor, which effectively blocks a bridge between the lower plates of the capacitor by enhancing the surface area of a lower plate of a capacitor through a SEA process. Additionally, by using an HLD oxide film in place of a conventional SOG oxide film, it can also be easier to control particles, which in turn can further improve the reliability of the fabrication of the semiconductor device.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for fabricating a lower plate of a capacitor of a semiconductor device, comprising:
   forming a planarization layer on a semiconductor substrate;
   forming a conductive plug in the planarization layer;
   forming a first nitride film on the planarization layer and the top surface of the conductive plug;
   forming a first oxide film on the top surface of the first nitride film with a trench in the first oxide film around the conductive plug;
   forming a second nitride film in the trench;
   removing the first oxide film;
   forming a second oxide film over at least a portion of the second nitride film;
   exposing the top surface of the conductive plug;
   forming a silicon layer pattern on the top surface of the conductive plug and the side walls of the second oxide film;
   removing the second oxide film;
   forming silicon grains on the surface of the silicon layer pattern; and
   removing the second nitride film.

2. The method according to claim 1, wherein the forming of the second nitride film in the trench comprises:
   forming the second nitride film in the trench and on the top surface of the first oxide film; and
   removing the second nitride film on the top surface of the first oxide film.

3. The method according to claim 1, wherein the removing of the second nitride film comprises an etchback process.

4. The method according to claim 1, wherein the removing of the second nitride film comprises a chemical mechanical polishing process.

5. The method according to claim 1, wherein the first oxide film is formed of a silicon oxide film.

6. The method according to claim 5, wherein the silicon oxide film is formed using chemical vapor deposition.

7. The method according to claim 6, wherein the chemical vapor deposition uses tetra ethyl orthosilicate (TEOS).

8. The method according to claim 1, wherein the second oxide film is formed of a silicon oxide film deposited on the top surface of the first and second nitride films by high temperature-low pressure chemical vapor deposition.

9. The method according to claim 1, wherein exposing the top surface of the conductive plug comprises sequentially anisotropically etching the second oxide film and the first nitride film without using a mask.

10. The method according to claim 1, wherein the forming of the silicon layer pattern comprises:
   depositing an amorphous silicon layer on the top surface of the conductive plug, the top surface and the side walls of the second oxide film, and the top surface of the second nitride film;
   thickly forming a photoresist layer on the amorphous silicon layer so that the top surface of the amorphous silicon layer is not exposed;
   selectively removing the photoresist layer so that the top surface of the amorphous silicon layer not adjacent to the conductive plug is exposed; and
   removing the amorphous silicon layer on the top surface of the second nitride film.

11. The method according to claim 10, wherein the removing of the silicon layer on the top surface of the second nitride film comprises an etchback process.

12. The method according to claim 10, wherein the removing of the amorphous silicon layer on the top surface of the second nitride film comprises a chemical mechanical polishing process.

13. The method according to claim 1, wherein the silicon grains are formed in a hemispherical shaped silicon grain layer.

14. The method according to claim 13, wherein the forming of a hemispherical shaped silicon grain layer comprises:
   depositing silicon grains on the surface of the silicon layer pattern; and
   forming a hemispherical shaped silicon grain layer on the surface of the silicon layer pattern by thermally treating the silicon layer pattern.

15. The method according to claim 14, wherein the depositing of the silicon grains comprises:
   putting the silicon layer pattern into a vacuum anneal chamber; and
   decomposing $Si_2H_6$ or $SiH_4$ gas at a temperature of 500~600° C. under a pressure of $10^{-7}$~$10^{-8}$ torr.

16. The method according to claim 1, wherein the removing of the second nitride film comprises a wet etching method using a phosphatic ($H_3PO_4$) solution.

17. A method for fabricating a lower plate of a capacitor of a semiconductor device, comprising:

forming a planarization layer on a semiconductor substrate;

forming a contact hole in the planarization layer;

forming a conductive plug to be electrically connected to the semiconductor substrate in the contact hole;

forming a first nitride film on the planarization layer and the top surface of the conductive plug;

forming a first oxide film on the top surface of the first nitride film;

forming a trench around the conductive plug by partially removing the first oxide film;

forming a second nitride film in the trench;

removing the first oxide film;

forming a second oxide film on the top surface of the second nitride film and the first nitride film;

exposing the top surface of the conductive plug;

forming an amorphous silicon layer on the top surface of the conductive plug, the top surface and the side walls of the second oxide film and the top surface of the second nitride film;

thickly forming a photoresist layer on the amorphous silicon layer so that the top surface of the amorphous silicon layer is not exposed;

selectively removing the photoresist layer so that the top surface of the amorphous silicon layer is exposed;

removing the amorphous silicon layer on the top surface of the second nitride film to form an amorphous silicon layer pattern;

removing the second oxide film;

depositing silicon grains on the surface of the amorphous silicon layer pattern;

forming a hemispherical silicon grain layer by thermally treating the silicon grains and the amorphous silicon layer pattern; and etching and removing the second nitride film.

18. The method according to claim 17, wherein the first oxide film is formed using tetra ethyl orthosilicate (TEOS), wherein the second oxide film is formed using high temperature-low pressure chemical vapor deposition, and wherein the silicon grains are formed in a hemispherical shaped grain layer.

* * * * *